(12) United States Patent
Nichols

(10) Patent No.: US 7,095,615 B2
(45) Date of Patent: Aug. 22, 2006

(54) ENVIRONMENTALLY TUNED CIRCUIT CARD ASSEMBLY AND METHOD FOR MANUFACTURING THE SAME

(75) Inventor: Randolph G. Nichols, New Port Richey, FL (US)

(73) Assignee: Honeywell International, Inc., Morristown, NJ (US)

( * ) Notice: Subject to any disclaimer, the term of this patent is extended or adjusted under 35 U.S.C. 154(b) by 259 days.

(21) Appl. No.: 10/705,906

(22) Filed: Nov. 13, 2003

(65) Prior Publication Data

US 2005/0105276 A1    May 19, 2005

(51) Int. Cl.
*H05K 7/20* (2006.01)

(52) U.S. Cl. .................. 361/719; 361/704; 361/713

(58) Field of Classification Search ........ 361/704–705, 361/707–708, 710, 713–715, 719
See application file for complete search history.

(56) References Cited

U.S. PATENT DOCUMENTS

| | | | |
|---|---|---|---|
| 4,409,641 A | 10/1983 | Jakob et al. | |
| 4,546,412 A | 10/1985 | Nakazawa et al. | |
| 4,612,601 A * | 9/1986 | Watari | 361/705 |
| 4,764,845 A * | 8/1988 | Artus | 361/705 |
| 4,849,858 A | 7/1989 | Grapes et al. | |
| 5,009,311 A * | 4/1991 | Schenk | 206/706 |
| 5,208,732 A | 5/1993 | Baudouin et al. | |
| 5,293,002 A * | 3/1994 | Grenet et al. | 174/52.2 |
| 5,396,403 A * | 3/1995 | Patel | 361/705 |
| 5,508,885 A | 4/1996 | Ishimoto | |
| 5,541,448 A | 7/1996 | Carpenter | |
| 5,646,831 A | 7/1997 | Manteghi | |
| 5,672,414 A | 9/1997 | Okamoto et al. | |
| 5,717,160 A * | 2/1998 | Bootle | 174/35 R |
| 5,724,729 A * | 3/1998 | Sherif et al. | 29/840 |
| 5,768,104 A | 6/1998 | Salmonson et al. | |
| 5,777,847 A | 7/1998 | Tokuno et al. | |
| 5,812,375 A | 9/1998 | Casperson | |
| 5,887,435 A | 3/1999 | Morton | |
| 6,101,090 A | 8/2000 | Gates | |
| 6,101,094 A | 8/2000 | Kermaani et al. | |
| 6,175,501 B1 | 1/2001 | Bortolini et al. | |
| 6,317,324 B1 | 11/2001 | Chen et al. | |
| 6,452,804 B1 | 9/2002 | Dibene, II et al. | |
| 2002/0158330 A1 | 10/2002 | Moon et al. | |

FOREIGN PATENT DOCUMENTS

| | | |
|---|---|---|
| DE | 199 10500 A1 | 10/2000 |
| EP | 0 863 694 A1 | 9/1998 |
| JP | 4-329697 | 11/1992 |

* cited by examiner

*Primary Examiner*—Lynn Feild
*Assistant Examiner*—Robert J. Hoffberg
(74) *Attorney, Agent, or Firm*—Fogg & Associates, LLC; David N. Fogg

(57) ABSTRACT

A circuit card assembly and a method for manufacturing the circuit card assembly are disclosed. The circuit card assembly includes a printed wiring board with electronic components bonded thereto. The printed wiring board and electronic components are placed in an outer shell made of lightweight stiff material. The spaces or voids between the outer shell and the printed wiring board and the electronic components are filled with lightweight filling material and thermal filler material. The outer shell and the filling material provide increased rigidity to the electronic components and the thermal filler material increases heat transfer from a given electronic component to outside the circuit card assembly.

12 Claims, 3 Drawing Sheets

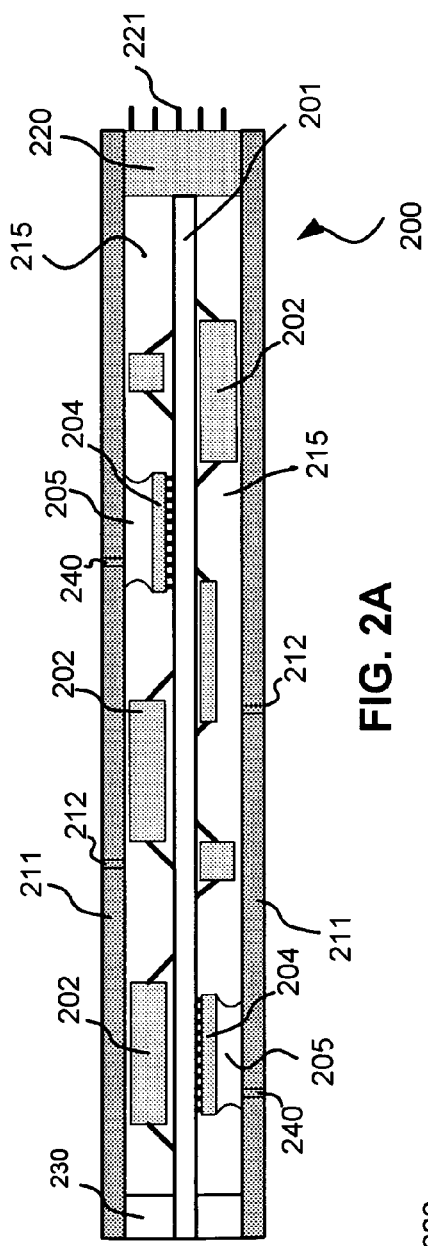
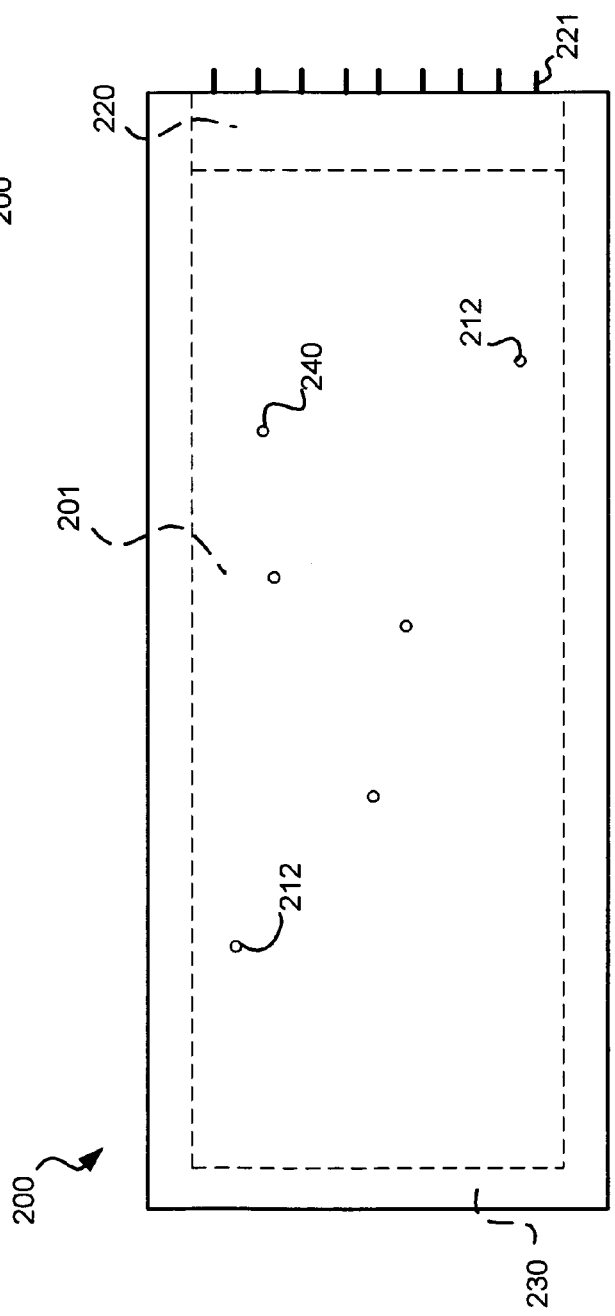
FIG. 2A
FIG. 2B

ENVIRONMENTALLY TUNED CIRCUIT CARD ASSEMBLY AND METHOD FOR MANUFACTURING THE SAME

BACKGROUND

1. Field of the Invention

The present invention relates to circuit card assemblies and more particularly, to a structure of a circuit card assembly that can be used in harsh dynamic and thermal environments.

2. Background of the Invention

In an effort to modularize the assembly of electronic devices, electronic components are frequently assembled together on a single circuit card assembly. A circuit card assembly often contains one or more complete circuits for performing selected functions. Circuit card assemblies are typically handled as a single part of a larger circuit or device at assembly time, thereby increasing production speed and simplifying the overall assembly process of the larger circuit or device.

FIGS. 1A and 1B illustrate a prior art circuit card assembly, in which FIG. 1A is a top view of an exemplary circuit card assembly 10 and FIG. 1B is a cross-sectional view thereof. As shown in these Figures, electronic components 11 can be bonded either on an upper surface or both of the upper surface and a lower surface of a printed wiring board (PWB) substrate 12. In the case that electronic components 11 are bonded to both surfaces of PWB substrate 12, vias 14 that penetrate through substrate 12 may be further provided for providing an electrical connection between the upper and lower surfaces of substrate 12. Circuit card assembly 10 further comprises a connector 13 that includes a plurality of pins (not shown) for electrically connecting circuit card assembly 10 with other electrical circuits (not shown) during an assembly process.

As more electronic components are included on a circuit card assembly, its failure rate increases when it is subjected to harsh environments, such as harsh dynamic or thermal environments. One reason for the higher failure rate is that electronic components 11 are exposed without protection, resulting in damage caused by heat or moisture in the environment. Another reason is that electronic components 11 are not properly supported so that components 11 can be shaken loose from the circuit card assembly.

To alleviate this failure rate problem, circuit card assemblies have been "bulked up" with heavy stiffening materials to increase their rigidity. Stiffening can be accomplished by attaching either stiffening ribs or plate structures to the surface of PWB 12 or by providing additional layers of substrate material. In addition, circuit card assemblies are often mounted in aluminum housings that surround the assemblies to control electromagnetic interference (EMI). As a by-product, these housings provide rigidity to the circuit card assembly. These stiffening methods (intentional or otherwise), however, significantly increase the size and weight of the circuit card assembly, thereby making such assemblies difficult to work with especially in compact-size electronic devices.

Accordingly, there is a need to develop a new circuit card assembly structure that can effectively protect the electronic components mounted thereon without largely increasing the weight and volume of the overall circuit card assembly.

SUMMARY OF THE INVENTION

The present invention, as described in the exemplary embodiments presented herein, addresses the deficiencies of the conventional circuit card assembly as described above. The exemplary embodiments of the present invention provide a structure wherein the electronic components mounted on the circuit card assembly are protected from harsh dynamic and thermal environments.

In its essence, the present invention provides a circuit card assembly with increased rigidity by employing composite structure technology. This approach also permits the circuit card assembly to be employed in relatively, physically, smaller applications.

In an exemplary embodiment of the present invention, a circuit card assembly includes a printed wiring board with electronic components mounted thereto. A shell comprising planar sheets of composite material is disposed on opposite sides of the printed wiring board. The planar sheets are spaced from each other via at least one of a spacer and a connector for electrically connecting the printed wiring board and electronic components with an external circuit. A lightweight material fills a void between the shell and the printed wiring board and electronic components. In addition, a thermal filler, different in composition from the lightweight material, is disposed between the shell and at least one of the electronic components.

In another exemplary embodiment of the present invention, a method of manufacturing a circuit card assembly is provided. The method comprises the steps of mounting electronic components on a printed wiring board, placing the printed wiring board with the electronic components into a shell made of composite material, injecting a thermal filler into the shell in a region substantially between the shell and at least one electronic component, and injecting a lightweight filling material to fill any remaining voids in the shell.

The features and advantages of the present invention will be more fully appreciated upon a reading of the following detailed description in combination with the accompanying drawings.

BRIEF DESCRIPTION OF THE DRAWINGS

FIG. 2A is a schematic diagram of a cross section of an exemplary circuit card assembly in accordance with the present invention.

FIG. 2B is a schematic diagram of a top view of the exemplary circuit card assembly of FIG. 2A.

DETAILED DESCRIPTION OF PREFERRED EMBODIMENTS

Figure 1A:
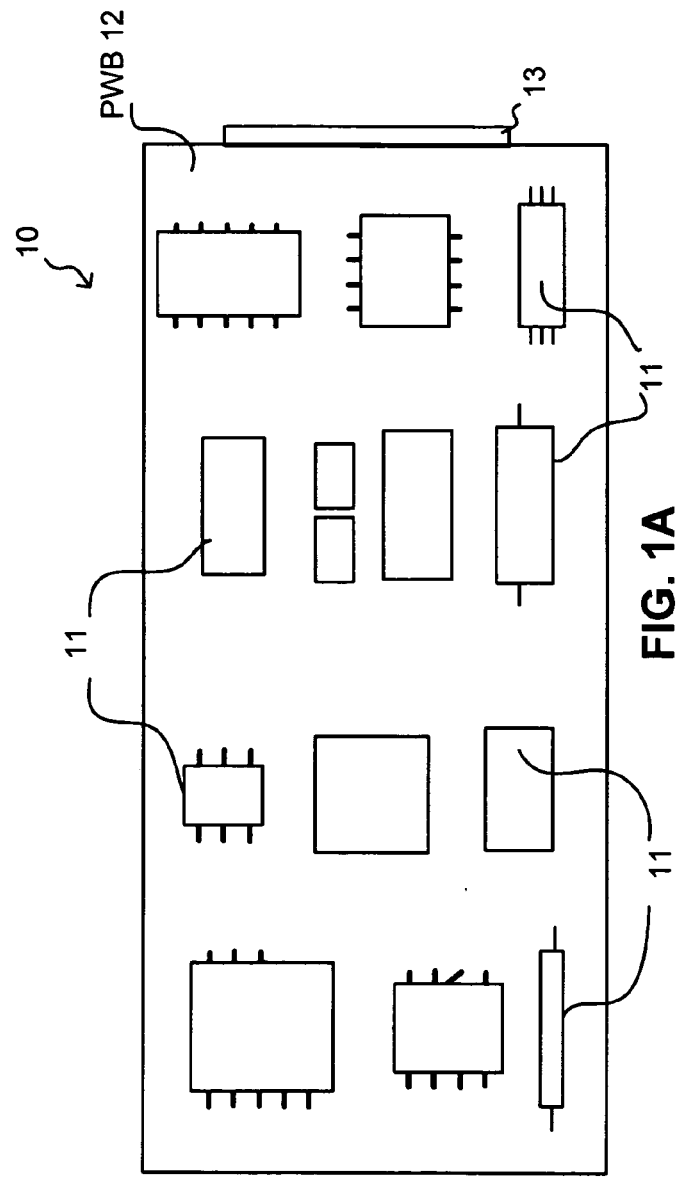
FIG. 1A is a schematic diagram of a top view of a prior art circuit card assembly.
Figure 1B:
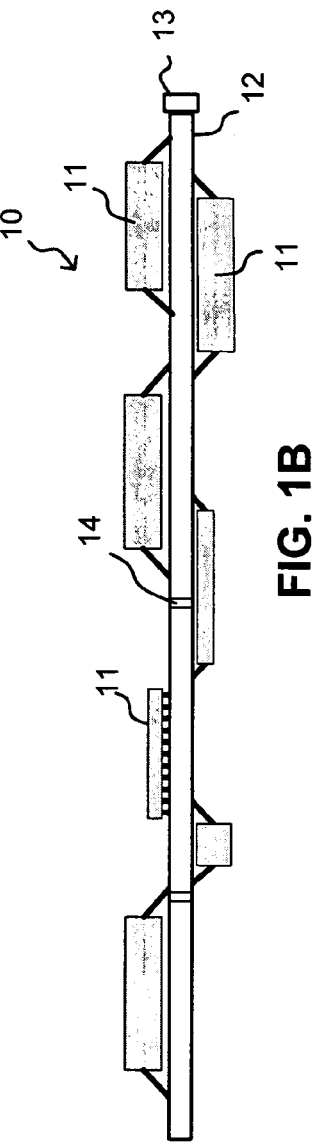
FIG. 1B is a schematic diagram of a cross section of the prior art circuit card assembly of FIG. 1A.

The present invention provides a circuit card assembly with increased rigidity by utilizing lightweight composite structure technology. In accordance with the present invention, the composite structure comprises a thin, stiff outer shell separated by lightweight filler material. The circuit card assembly is disposed inside the shell and surrounded by the filler material.

An exemplary embodiment of the present invention is shown in FIGS. 2A and 2B as lightweight circuit card assembly 200. Although circuit card assembly 200 is shown having a substantially rectangular shape, the present invention is not limited to such a shape or geometry. Other shapes and geometries are possible depending on the particular application.

Circuit card assembly (CCA) 200 includes a PWB 201 and electronic components 202, 204 attached to both sides of PWB 201. A connector 220 is disposed at an end of CCA 200 and has at least one connecting pin 221 that extends outwardly from CCA 200 for connecting with external electrical circuitry (not shown). PWB 201 can be comprised of conventional polymer-glass or multiplayer ceramic materials. Electronic components 202, 204 may include computer IC chips, resistors, capacitors, coils, and the like. As some components, particularly computer IC chips, are heat-generating components, the material of PWB 201 is preferably chosen so that PWB 201 can endure a high density interconnection and can tolerate thermal expansion related to the computer IC chips.

In accordance with the present invention, PWB 201 and electronic components 202, 204 are placed inside outer shell 211. Outer shell 211 preferably comprise thin, lightweight and stiff composite planar sheets made of, e.g., carbon fiber. The planar sheets are spaced from each other via at least one of spacer 230 and connector 220. To provide the desired rigidity to PWB 201 and mounted electronic components 202, 204, the void between outer shell 211 and PWB 201 and electronic components 202, 204 is preferably filled with lightweight filter 215. Lightweight filler 215 can be, for example, expandable foam, which is injected into outer shell 211 through squirt holes 212 (only two are shown for simplification) of outer shell 211. Preferably, filler 215 is dynamically tuned to optimize at least (1) dynamic response of circuit card assembly 200, (2) moisture control, and (3) reworkability of circuit card assembly 200. The term "dynamically tuned" is intended to mean that the dynamic characteristics (natural frequency and amplitude at resonance) of circuit card assembly 200 are adjusted (tuned) to provide the least sensitivity to dynamic environments imposed on the assembly.

To compensate for heat dissipating components, the present invention preferably further provides thermal fillers 205 at voids between shell 211 and electronic components 204 that generate heat when in use. Thermal filler 205 can be, for example, silver-filled silicone or epoxy, both of which have good thermal properties. By using thermal fillers, the heat generated by electronic elements 204 can be more easily transferred from a given component to outer shell 211 and thus outside of CCA 200. In accordance with the present invention, the material of outer shell 211 is selected to provide a good medium for heat transfer, in addition to providing lightweight stiffness. It is also noted that outer shell 211 can also provide EMI shielding. Thermal filler 205 is preferably injected via squirt hole 204, which is positioned adjacent a heat-generating component.

In the illustrated Figures, connector 220 is installed at one edge of outer shell 211. The other edges of outer shells 211 contain spacer 230 made of, for example, aluminum. It is noted that although connector 220 of FIG. 2A is shown at an edge of CCA 200, connector 220 can be situated at other positions, depending on the configuration of the CCA and the electrical device in which CCA 200 is intended to be used.

As shown in FIG. 2A, PWB 201 and electronic components 202, 204 are covered by shell 211 and are stabilized by lightweight filler 215. Accordingly, this arrangement provides circuit card assembly 200 with sufficient rigidity so that circuit card assembly 200 has increased tolerance to harsh environments. The top view of FIG. 2B shows outer shell 211, squirt holes 212, 240 through outer shell 211, and connecting pins 221. The dashed line of FIG. 2B shows an exemplary position of spacer 230. Although FIG. 2B shows that outer shell 211 comprises a pair of planar sheets and spacer 230 fills the space formed by the opposing planar sheets, outer shell 211 could also be tube-shaped so that spacer 230 need only plug one end of the shell.

Figure 3:
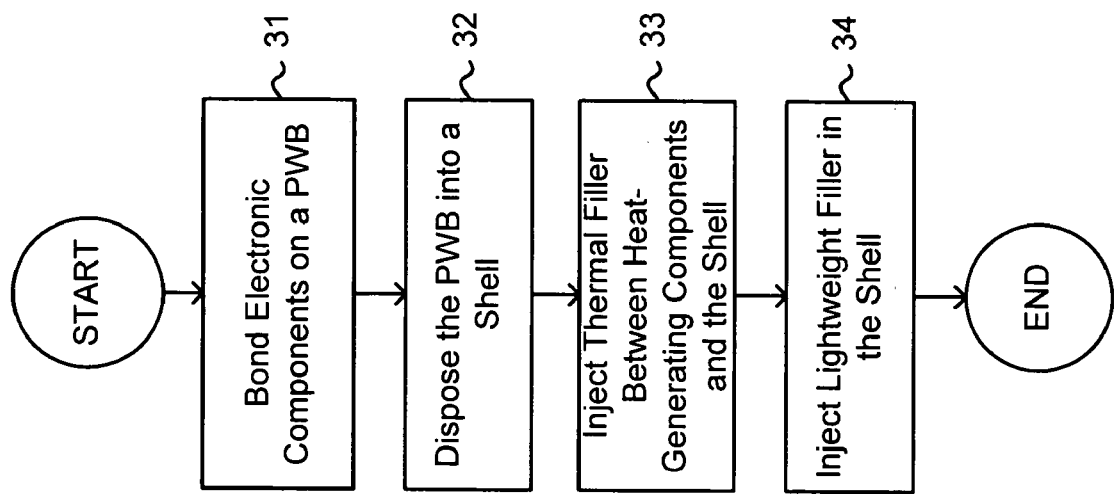
FIG. 3 illustrates a flow chart of a method for manufacturing a circuit card assembly in accordance with the present invention.

FIG. 3 illustrates a flow chart of a method for manufacturing CCA 200 in accordance with the present invention.

As step 31, electronic components are first mounted on a printed wiring board (PWB) as is conventional. At step 32, the PWB with mounted electronic components is inserted into a shell that is comprised of, for example, two sheets of stiff composite material separated around a periphery by a spacer and a connector of the PWB. As described above, the shell may be made of a material, such as carbon fiber. The PWB with electronic components mounted thereon is placed in the shell in a such way that the connector extends outwardly from the shell.

At step 33, to provide improved heat-dissipation for selected electronic components, a thermal filler is first provided between the heat-generating electronic components and the shell. The thermal filler provides a heat dissipation path so that the heat generated by heat-generating electronic components can be effectively transferred toward the outside of the shell via the thermal filler and the shell. As described above, the thermal filler can be made of silver-filled silicone or epoxy. The thermal filer can be injected into the shell via squirt holes in the shell that are strategically positioned near selected electronic components.

At step 34, an expandable filling material is injected into the shell. The filling material can be a lightweight expandable material, such as foam, which provides the PWB and electronic components with further rigidity.

The exemplary devices and methods described herein according to the present invention have many advantages. One advantage is that electronic components 202 and 204 have better rigidity via the support of outer shell 211 and lightweight filler 215. Another advantage is that thermal filler 205 and outer shell 211 provide a good path for dissipating heat generated by heat-generating electronic components 204.

In describing representative embodiments of the invention, the specification may have presented the method and/or process of the invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the invention should not be limited to the performance of their steps in the order written, and one skilled in the art can readily appreciate that the sequences may be varied and still remain within the spirit and scope of the invention.

The foregoing disclosure of the embodiments of the invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

What is claimed is:

1. A circuit card assembly, comprising:
   a printed wiring board with electronic components mounted thereto;
   a shell comprising planar sheets of composite material disposed on opposite sides of the printed wiring board, the planar sheets being spaced from each other via at least one of a spacer and a connector for electrically connecting the printed wiring board and electronic components with an external circuit;
   a thermal filler disposed between the shell and at least one of the electronic components that generates heat when in use, the thermal filler substantially filling without interruption a space defined by the at least one of the electronic components and a portion of the shell directly opposite the at least one of the electronic components; and
   a lightweight material, different in composition from the thermal filler, filling a void between the shell and the printed wiring board and electronic components that is not filled by the thermal filler.

2. The circuit card assembly of claim 1, wherein the lightweight material is made of expandable foam.

3. The circuit card assembly of claim 1, wherein at least one of the thermal filler and the lightweight material is injected into the outer shell though holes in the outer shell.

4. The circuit card assembly of claim 1, wherein the thermal filler provides thermal dissipation for the at least one electronic component.

5. The circuit card assembly of claim 1, wherein the thermal filler comprises silver-filled silicone or epoxy.

6. The circuit card assembly of claim 1, wherein the composite material comprises carbon fiber.

7. An apparatus for providing rigidity to a circuit card assembly, wherein the circuit card assembly comprises a printed wiring board and electronic components mounted thereon, the apparatus comprising:
   a shell comprised of thin lightweight planar sheets for covering the printed wiring board and electronic components mounted thereon, wherein the planner sheets are spaced from each other via at least one of a spacer and a connector for electrically connecting the printed wiring board and electronic components mounted thereon with an external circuit;
   a thermal filler disposed in a region between the shell and at least one of the electronic components that generates heat when in use, the thermal filler substantially filling without interruption a space defined by the at least one of the electronic components and a portion of the shell directly opposite the at least one of the electronic components; and
   a lightweight material substantially filling any remaining voids between the shell and the printed wiring board and electronic components.

8. The apparatus of claim 7, wherein at least one of the thermal filler and the lightweight material is injected into the shell through squirt holes in the shell.

9. The apparatus of claim 7, wherein the thermal filler comprises silver-filled silicone or epoxy.

10. The apparatus of claim 7, wherein the planar sheets are comprised of carbon fiber.

11. A method of manufacturing a circuit card assembly, comprising:
    mounting electronic components on a printed wiring board, wherein the printed wiring board comprises a connector for electrically connecting the printed wiring board with an external electrical circuit;
    placing the printed wiring board with the electronic components into a shell made of a lightweight material, wherein the connector extends outwardly from the shell;
    injecting a thermal filler into the shell in a region between the shell and at least one electronic component that generates heat when in use; and
    injecting a lightweight filling material to substantially fill any remaining voids in the shell after the thermal filler is injected.

12. The method of claim 11, wherein the shell comprises planar sheets of composite material disposed on opposite sides of the printed wiring board, the planar sheets being spaced from each other via at least one of a spacer and a connector for electrically connecting the printed wiring board and electronic components with an external circuit.

* * * * *